United States Patent
Yamada

(10) Patent No.: US 9,325,278 B2
(45) Date of Patent: *Apr. 26, 2016

(54) RESONATOR ELEMENT, RESONATOR, AND OSCILLATOR

(71) Applicant: SEIKO EPSON CORPORATION, Tokyo (JP)

(72) Inventor: Akinori Yamada, Ina (JP)

(73) Assignee: SEIKO EPSON CORPORATION, Tokyo (JP)

( * ) Notice: Subject to any disclaimer, the term of this patent is extended or adjusted under 35 U.S.C. 154(b) by 56 days.

This patent is subject to a terminal disclaimer.

(21) Appl. No.: 14/284,850

(22) Filed: May 22, 2014

(65) Prior Publication Data

US 2014/0253254 A1  Sep. 11, 2014

Related U.S. Application Data

(63) Continuation of application No. 13/176,332, filed on Jul. 5, 2011, now Pat. No. 8,760,235.

(30) Foreign Application Priority Data

Jul. 9, 2010  (JP) ................................ 2010-156577

(51) Int. Cl.
  *H03H 9/215* (2006.01)
  *H03B 5/30* (2006.01)
  (Continued)

(52) U.S. Cl.
  CPC .............. *H03B 5/30* (2013.01); *H03H 9/02102* (2013.01); *H03H 9/0519* (2013.01); *H03H 9/1021* (2013.01); *H03H 9/21* (2013.01)

(58) Field of Classification Search
  CPC ...................................................... H03H 9/215

USPC ............................ 331/156; 310/370; 333/200
See application file for complete search history.

(56) References Cited

U.S. PATENT DOCUMENTS 7,193,354 B2   3/2007  Kawashima
7,626,318 B2   12/2009  Dalla Piazza et al.
(Continued)

FOREIGN PATENT DOCUMENTS

JP     U-2-32229     2/1990
JP     A-2005-39767  2/2005
(Continued)

OTHER PUBLICATIONS

Mar. 5, 2013 Notice of Allowance issued in U.S. Appl. No. 13/176,192.
(Continued)

*Primary Examiner* — Joseph Chang
(74) *Attorney, Agent, or Firm* — Oliff PLC

(57) ABSTRACT

A resonator element includes: at least one resonating arm extending, wherein the resonating arm has a mechanical resonance frequency which is higher than a thermal relaxation frequency thereof, the resonating arm has a groove portion, the groove portion includes a bottom portion, a first side surface that extends along the longitudinal direction of the resonating arm and comes into contact with the opened principal surface and the bottom portion, and a second side surface that faces the first side surface with the bottom portion disposed therebetween and comes into contact with the opened principal surface and the bottom portion, and the groove portion has a non-electrode region which extends from a part of the first side surface close to the bottom portion to a part of the second side surface close to the bottom portion and in which no electrode is provided.

17 Claims, 4 Drawing Sheets

(51) Int. Cl.
*H03H 9/02* (2006.01)
*H03H 9/05* (2006.01)
*H03H 9/10* (2006.01)
*H03H 9/21* (2006.01)

(56) References Cited

U.S. PATENT DOCUMENTS

| | | | |
|---|---|---|---|
| 8,164,393 | B2 | 4/2012 | Yamada |
| 2005/0104480 | A1 | 5/2005 | Tanaya |
| 2007/0159029 | A1 | 7/2007 | Aratake |
| 2009/0289531 | A1* | 11/2009 | Fang et al. .................... 310/370 |
| 2010/0029898 | A1 | 2/2010 | Cirakovic |
| 2010/0164331 | A1 | 7/2010 | Yamada |
| 2010/0171397 | A1 | 7/2010 | Yamada |
| 2010/0219898 | A1 | 9/2010 | Yamada |
| 2010/0244989 | A1 | 9/2010 | Furuhata et al. |
| 2011/0018402 | A1* | 1/2011 | Kobayashi .................... 310/365 |
| 2012/0007684 | A1 | 1/2012 | Yamada |

FOREIGN PATENT DOCUMENTS

| | | |
|---|---|---|
| JP | A-2006-352771 | 12/2006 |
| JP | A-2007-158386 | 6/2007 |
| JP | A-2009-27711 | 2/2009 |
| JP | A-2010-50960 | 3/2010 |
| JP | A-2010-157933 | 7/2010 |
| JP | A-2010-171965 | 8/2010 |
| JP | A-2010-171966 | 8/2010 |
| JP | A-2010-226608 | 10/2010 |
| JP | A-2010-226610 | 10/2010 |
| JP | A-2010-233204 | 10/2010 |
| JP | A-2010-252302 | 11/2010 |
| WO | WO 00/44092 A1 | 7/2000 |

OTHER PUBLICATIONS

Oct. 23, 2012 Office Action issued in U.S. Appl. No. 13/176,192.

\* cited by examiner

RESONATOR ELEMENT, RESONATOR, AND OSCILLATOR

REFERENCE TO CO-PENDING APPLICATIONS

This application is a Continuation of application Ser. No. 13/176,332 filed Jul. 5, 2011. U.S. application Ser. No. 13/176,332 claims priority to JP 2010-156577 filed Jul. 9, 2010. The disclosure of the prior applications is hereby incorporated by reference herein in their entirety.

BACKGROUND

1. Technical Field

The present invention relates to a resonator element, a resonator having the resonator element, and an oscillator having the resonator element.

2. Related Art

In the related art, a tuning-fork type piezoelectric resonator element (hereinafter referred to as a resonator element) in which a pair of resonating arms alternately vibrates in the flexural vibration mode in the direction towards or away from each other is widely used as a resonator element.

A loss of vibration energy when such a resonator element vibrates in the flexural vibration mode leads to an increase of the CI (Crystal Impedance) value or a decrease of the Q value and thus causes deterioration of performances. Here, the CI value is a value which serves as an indicator of the likelihood of oscillation, and the lower it is, the more the resonator element is likely to oscillate. The Q value is a dimensionless number representing a vibration state, and the higher it is, the more the resonator element vibrates stably.

Thermal conduction is considered as one of the causes of the loss of vibration energy.

FIG. 4A is a diagram illustrating thermal conduction in a resonator element. As shown in FIG. 4A, a resonator element 151 includes two parallel resonating arms 153 and 154 extending from a base portion 152.

When a predetermined voltage is applied to an electrode (not shown) in such a state, the resonating arms 153 and 154 vibrate in the direction towards or away from each other. When the resonating arms 153 and 154 are moved away from each other, compressive stress acts on hatched regions A (the outer root portions of the resonating arms 153 and 154), and tensile stress acts on hatched regions B (the inner root portions of the resonating arms 153 and 154).

When the resonating arms 153 and 154 are moved towards each other, tensile stress acts on the hatched regions A, and compressive stress acts on the hatched regions B.

At that time, temperature increases in the regions where compressive stress acts and decreases in the regions where tensile stress acts.

The resonator element 151 loses vibration energy due to heat transfer (thermal conduction) occurring due to equilibration of temperature between a contracted portion of the resonating arms 153 and 154 where compressive stress acts and an expanded portion where tensile stress acts.

A decrease of the Q value caused by such thermal conduction is referred to as thermoelastic loss.

From the relationship between distortion and stress which is well-known as a phenomenon of internal friction of a solid generally occurring due to a temperature difference, the thermoelastic loss is described as follows. In a flexural vibration-mode resonator element, when the vibration frequency changes, the Q value reaches the minimum at a relaxation vibration frequency fm ($=1/2\pi\tau$; here, $\tau$ is a relaxation time).

The relationship between the Q value and the frequency is generally expressed as a curve F in FIG. 4B. In the drawing, the frequency at which the Q value reaches the minimum Q0 is a thermal relaxation frequency f0 ($=1/2\pi\tau$).

Moreover, a region ($1<f/f0$) on the high frequency side in relation to a boundary of $f/f0=1$ is an adiabatic region, and a region ($f/f0<1$) on the low frequency side in relation to the boundary is an isothermal region.

FIGS. 5A and 5B are schematic diagrams showing a simplified configuration of a resonator element of the related art. FIG. 5A is a planar diagram, and FIG. 5B is a cross-sectional diagram taken along the line C-C in FIG. 5A.

As shown in FIGS. 5A and 5B, a resonator element 100 includes tuning-fork arms (hereinafter referred to as resonating arms) 102 and a tuning-fork base portion (hereinafter referred to as a base portion) 104. A groove 106 is formed on the upper and lower surfaces of each of the resonating arms 102, and electrodes 110 and 112 are disposed on the side surfaces of the groove 106.

The resonator element 100 also includes electrodes 114 and 116 which have different polarities and which are disposed on the side surfaces of each of the resonating arms 102 so as to face the electrodes 110 and 112 (for example, see JP-A-2005-39767).

In the resonator element 100 disclosed in JP-A-2005-39767, as shown in FIG. 5B, a thermal conduction path between the contracted portion and the expanded portion of the resonating arms 102 is narrowed in the midway by the grooves 106.

As a result, in the resonator element 100, a relaxation time $\tau$ up to the equilibration of the temperature of the contracted portion and the expanded portion increases.

Therefore, in the resonator element 100, since the grooves 106 are formed, in the adiabatic region shown in FIG. 4B, the shape of the curve F itself does not change, but with a decrease of the thermal relaxation frequency f0, the curve F shifts to the position of a curve F1 in the lower frequency direction. The curve F1 shows a state in which no electrode is formed in the groove 106.

As a result, in the resonator element 100, the Q value increases as indicated by the arrow a.

However, in the resonator element 100, when the electrodes 110 and 112 are formed in the grooves 106, the curve F shifts to the position of a curve F2, and the Q value decreases as indicated by the arrow b.

A thermal conduction path formed by the electrodes 110 and 112 can be considered as one of the reasons thereof.

That is, a conductive material such as an electrode material has higher thermal conductivity than a quartz crystal which is a piezoelectric material used as a base material of the resonator element 100. In such a conductive material, electrons as well as phonons of metal carry thermal energy.

Specifically, in the resonator element 100, as indicated by the arrows in FIG. 5B, since thermal conduction is carried out by the electrodes 110 and 112 as well as a quartz crystal, the relaxation time $\tau$ decreases, and with an increase of the thermal relaxation frequency f0, the curve F shifts to the position of the curve F2 in the higher frequency direction.

In order to solve this problem, a configuration in which the electrodes on the bottom portion of the groove are removed to suppress thermal conduction by the electrodes on the bottom portion, thus increasing the relaxation time $\tau$ may be considered.

However, with progress in the miniaturization of the resonator element, it is difficult to sufficiently improve the relaxation time $\tau$ just through removal of the electrodes on the bottom portion of the groove. Thus, it is not possible to achieve a sufficient improvement of the Q value.

SUMMARY

An advantage of some aspects of the invention is to solve at least a part of the problems described above and the invention can be implemented as the following forms or application examples.

Application Example 1

According to this application example of the invention, there is provided a resonator element including: a base portion; and at least one resonating arm extending from the base portion, wherein the resonating arm has a mechanical resonance frequency which is higher than a thermal relaxation frequency thereof, wherein the resonating arm has a groove portion which is formed on at least one of the principal surfaces facing each other and which extends in a longitudinal direction of the resonating arm, wherein the groove portion includes a bottom portion, a first side surface that extends along the longitudinal direction of the resonating arm and comes into contact with the opened principal surface and the bottom portion, and a second side surface that faces the first side surface with the bottom portion disposed therebetween and comes into contact with the opened principal surface and the bottom portion, and wherein the groove portion has a non-electrode region which extends from a part of the first side surface close to the bottom portion to a part of the second side surface close to the bottom portion and in which no electrode is provided.

According to this configuration, in the resonator element, the groove portion (synonymous with a groove) has a non-electrode region which extends from a part of the first side surface close to the bottom portion to a part of the second side surface close to the bottom portion and in which no electrode is provided. Thus, it is possible to suppress thermal conduction by the electrodes in such portions.

As a result, in the resonator element, the transfer of heat from the contracted portion to the expanded portion during flexural vibration is slowed down over a wider range of areas as compared to a configuration in which only the electrodes on the bottom portion of the groove portion are removed, for example. Thus, it is possible to further increase the relaxation time $\tau$ and to further decrease the thermal relaxation frequency f0.

Through the decrease of the thermal relaxation frequency f0, in the resonator element, the curve F in FIG. 4B shifts to the vicinity of the curve F1 in the lower frequency direction. Thus, it is possible to improve the Q value in the adiabatic region.

Application Example 2

In the resonator element of the above aspect, it is preferable that the resonating arm includes an arm portion which is disposed close to the base portion, and a weight portion which is disposed closer to a tip end of the resonating arm than the arm portion and which has a larger width than the arm portion.

According to this configuration, in the resonator element, the resonating arm includes an arm portion which is disposed close to the base portion, and a weight portion which is disposed closer to a tip end of the resonating arm than the arm portion and which has a larger width than the arm portion. Through the effect of improving the Q value by the weight portion which increases the inertial mass, it is possible to shorten the resonating arm while maintaining the Q value, for example.

Therefore, in the resonator element, it is possible to achieve further miniaturization while maintaining the Q value.

On the other hand, when the weight portion is provided in the resonator element, for example, the amount of deformation during flexural vibration increases as compared to a configuration in which no weight portion is provided. That is, the compressive and tensile stress occurring therein increases.

However, in the resonator element, since thermal conduction by the electrodes can be suppressed in the non-electrode region of the groove portion, the transfer of heat from the contracted portion to the expanded portion is slowed down. Thus, the thermoelastic loss can be suppressed more effectively when the weight portion is provided.

Application Example 3

In the resonator element of the above aspect, it is preferable that the resonator element includes a plurality of the resonating arms, and the plurality of resonating arms and the base portion form a tuning fork.

According to this configuration, the resonator element includes a plurality of the resonating arms and a base portion which form a tuning fork. Thus, it is possible to provide a tuning-fork resonator element having an improved Q value.

Application Example 4

According to this application example of the invention, there is provided a resonator including: the resonator element of the above aspect; and a package that accommodates the resonator element.

According to this configuration, since the resonator includes the resonator element of the above aspect, it is possible to provide a resonator having excellent vibration properties through the improvement in the Q value, for example.

Application Example 5

According to this application example of the invention, there is provided an oscillator including: the resonator element of the above aspect; a circuit element that has an oscillation circuit oscillating the resonator element; and a package that accommodates the resonator element and the circuit element.

According to this configuration, since the oscillator includes the resonator element of the above aspect, it is possible to provide an oscillator having excellent vibration properties through the improvement in the Q value, for example.

BRIEF DESCRIPTION OF THE DRAWINGS

The invention will be described with reference to the accompanying drawings, wherein like numbers reference like elements.

FIGS. 1A and 1B are schematic diagrams showing a simplified configuration of a resonator element according to a first embodiment, in which FIG. 1A is a planar diagram, and FIG. 1B is a cross-sectional diagram of FIG. 1A.

FIGS. 2A and 2B are schematic diagrams showing a simplified configuration of a resonator according to a second embodiment, in which FIG. 2A is a planar diagram, and FIG. 2B is a cross-sectional diagram of FIG. 2A.

FIGS. 3A and 3B are schematic diagrams showing a simplified configuration of an oscillator according to a third embodiment, in which FIG. 3A is a planar diagram, and FIG. 3B is a cross-sectional diagram of FIG. 3A.

FIGS. 5A and 5B are schematic diagrams showing a simplified configuration of a resonator element of the related art, in which FIG. 5A is a planar diagram, and FIG. 5B is a cross-sectional diagram of FIG. 5A.

DESCRIPTION OF EXEMPLARY EMBODIMENTS

Hereinafter, embodiments of the invention will be described with reference to the drawings.

First Embodiment

Figure 1A:
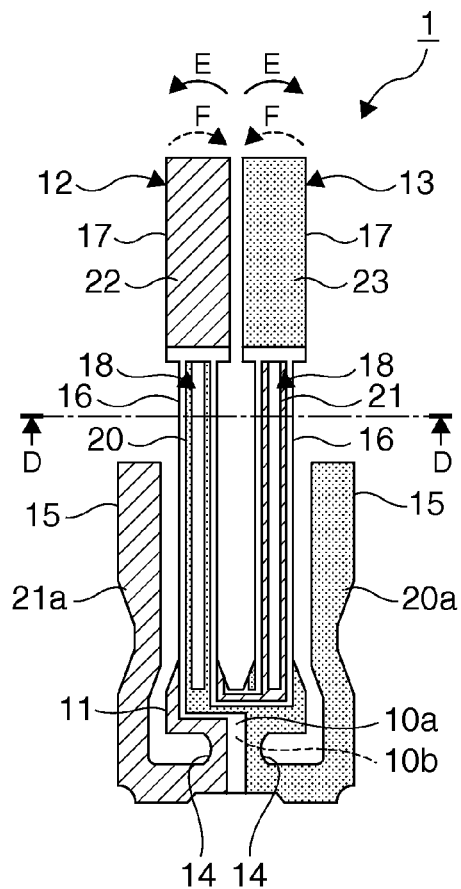
Figure 1B:
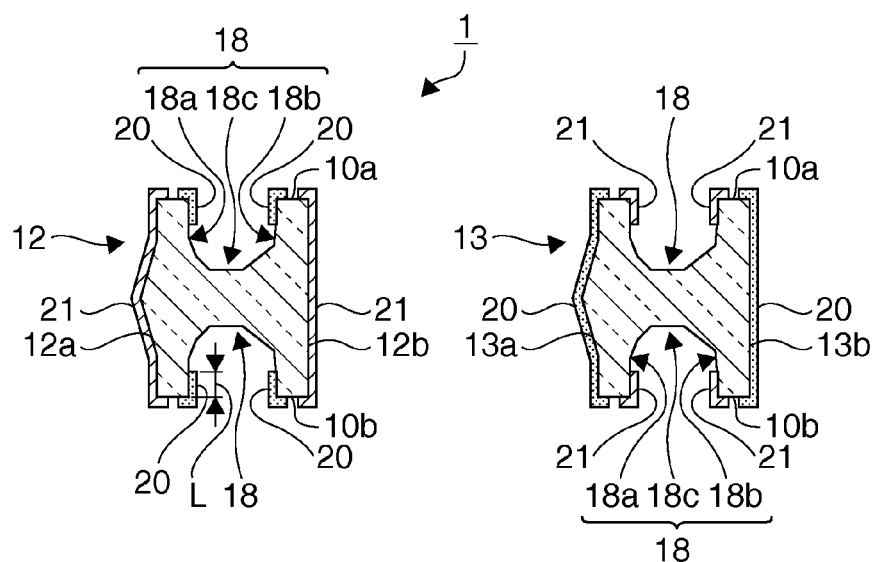

FIGS. 1A and 1B are schematic diagrams showing a simplified configuration of a resonator element according to a first embodiment, in which FIG. 1A is a planar diagram, and FIG. 1B is a cross-sectional diagram taken along the line D-D in FIG. 1A.

In FIG. 1A, hatching or shading is added to electrode parts for the sake of convenience, and the electrode parts are simplified or partially omitted for better understanding of the drawing.

As shown in FIGS. 1A and 1B, a crystal resonator element 1 used as a resonator element is a resonator element of which the outer shape is formed by wet-etching, using a photolithography technique, a wafer-shaped crystal substrate which is used as a base material and which is cut, for example, from crystal ore, at predetermined angles.

The crystal resonator element 1 includes a base portion 11, a pair of resonating arms 12 and 13 extending approximately in parallel from the base portion 11, a pair of notches 14 which is notched from both sides of the base portion 11 in a direction (the left-right direction of the drawing sheet) crossing the extension direction of the resonating arms 12 and 13, and a pair of supporting portions 15 protruding from the base portion 11 in the left-right direction of the drawing sheet, bent approximately at a right angle towards the resonating arms 12 and 13, and extending along the resonating arms 12 and 13.

The pair of resonating arms 12 and 13 includes an arm portion 16 positioned close to the base portion 11 and a weight portion 17 positioned closer to the tip end of each of the resonating arms 12 and 13 than the arm portion 16 and having a larger width than the arm portion 16.

Moreover, the pair of resonating arms 12 and 13 includes a groove 18 which is formed on principal surfaces 10a and 10b facing each other so as to extend along the longitudinal direction of the pair of resonating arms 12 and 13 and which is cut along the arrangement direction (the left-right direction of the drawing sheet) of the pair of resonating arms 12 and 13 so that the resonating arms 12 and 13 have an approximately H-shape in cross-sectional view.

The groove portion 18 includes a bottom portion 18c including the deepest portion, a first side surface 18a that is formed along the longitudinal direction of the resonating arms 12 and 13 and comes into contact with the opened principal surfaces 10a and 10b and the bottom portion 18c, and a second side surface 18b that faces the first side surface 18a with the bottom portion 18c disposed therebetween and comes into contact with the opened principal surfaces 10a and 10b and the bottom portion 18c.

The first and second side surfaces 18a and 18b are made up of a plurality of surfaces by etching anisotropy of a quartz crystal so that an abrupt slope changes to a smooth slope as it approaches the bottom portion 18c from the principal surfaces 10a and 10b.

The first and second side surfaces 18a and 18b may be made up of one surface.

The bottom portion 18c is illustrated to be inclined neither towards the first side surface 18a nor the second side surface 18b in FIG. 1B. However, the bottom portion 18c is not limited to this, but may be inclined towards the first side surface 18a or the second side surface 18b.

The crystal resonator element 1 includes excitation electrodes 20 and 21 used as electrodes which are formed on the groove portion 18 of the pair of resonating arms 12 and 13, the principal surfaces 10a and 10b, and the mutually facing side surfaces 12a and 12b, and 13a and 13b of the pair of resonating arms 12 and 13.

Next, the excitation electrodes 20 and 21 formed on the groove portion 18 will be described.

As shown in FIG. 1B, the groove portion 18 has a non-electrode region which extends from a part of the first side surface 18a close to the bottom portion 18c to a part of the second side surface 18b close to the bottom portion 18c and in which the excitation electrodes 20 and 21 are not provided.

In other words, the excitation electrodes 20 and 21 of the groove portion 18 are formed in part of the first and second side surfaces 18a and 18b close to the principal surfaces 10a and 10b. That is, the excitation electrodes 20 and 21 are formed in a range (L) of areas which are in the midway of a portion extending from the principal surfaces 10a and 10b towards the bottom portion 18c.

The range L of areas in which the excitation electrodes 20 and 21 of the groove portion 18 are formed is appropriately set, for example, considering a balance between the desired Q and CI values.

The range L of areas in which the excitation electrodes 20 and 21 are formed may be different in length between the first and second side surfaces 18a and 18b.

The range of formation areas of the excitation electrodes 20 and 21 in the longitudinal direction of the groove portion 18 is appropriately set based on requirements such as desired load capacitance sensitivity (frequency-load capacitance characteristics).

As shown in FIGS. 1A and 1B, the crystal resonator element 1 includes the base portion 11 and the pair of resonating arms 12 and 13 which form a tuning fork, whereby a tuning fork-type crystal resonator element used as a tuning fork-type resonator element is obtained. The crystal resonator element 1 is fixed to an external member such as a package at a predetermined position of each of the supporting portions 15.

In the crystal resonator element 1, when an external driving signal is applied to the excitation electrodes 20 and 21 formed on the resonating arms 12 and 13, the pair of resonating arms 12 and 13 alternately vibrate (resonate) in the flexural vibration mode at a predetermined resonance frequency (for example, 32 kHz) in the directions indicated by the arrows E and F.

The crystal resonator element 1 has a mechanical resonance frequency f which is set so as to be higher than a thermal relaxation frequency f0. In other words, in the crystal resonator element 1, a value obtained by dividing the mechanical resonance frequency f by the thermal relaxation frequency f0 is set so as to exceed 1 (1<f/f0).

Figure 4A:
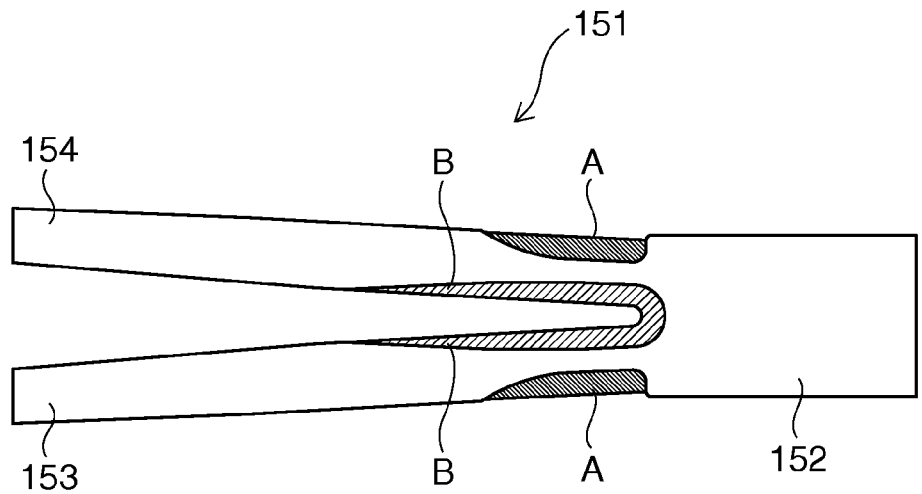
FIG. 4A is a diagram illustrating thermal conduction of a resonator element.
Figure 4B:
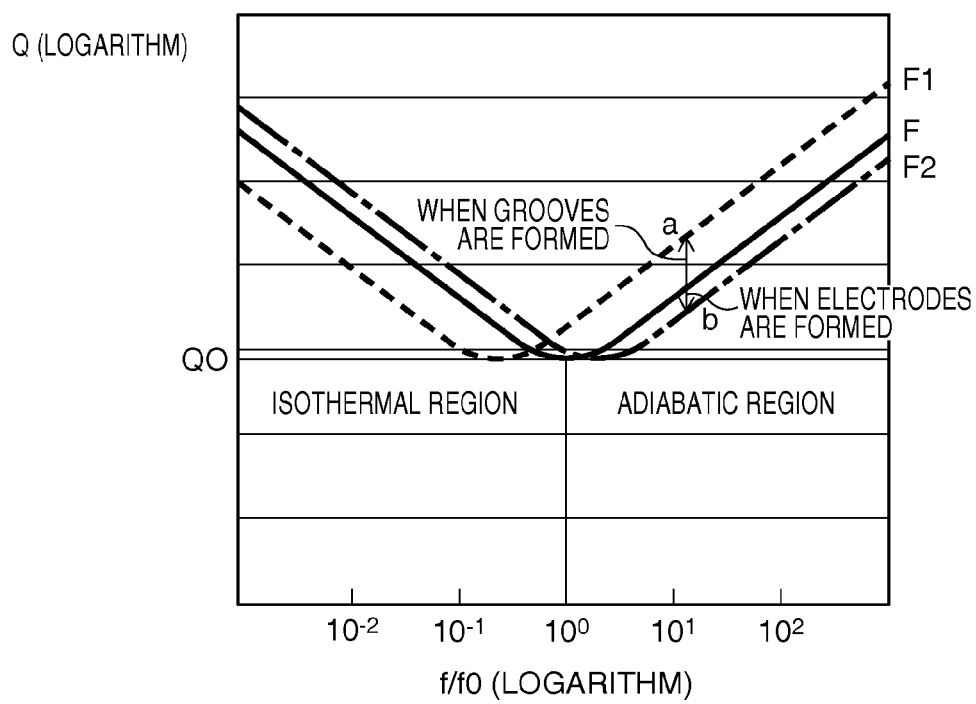
FIG. 4B is a diagram showing the relationship between a relaxation frequency of the resonator element and the minimum value of the Q value.
Figure 5A:
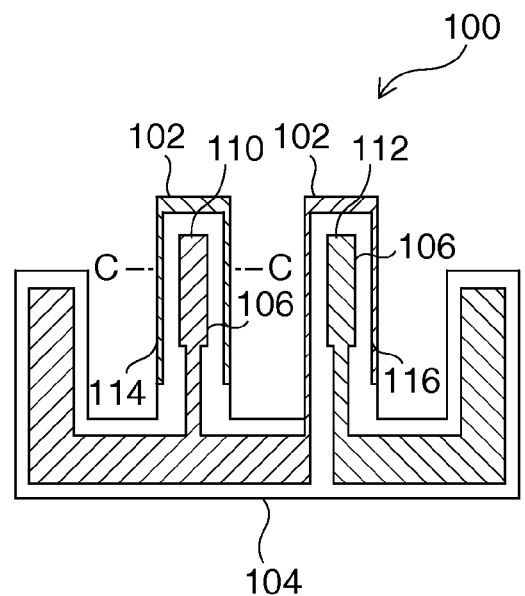
Figure 5B:
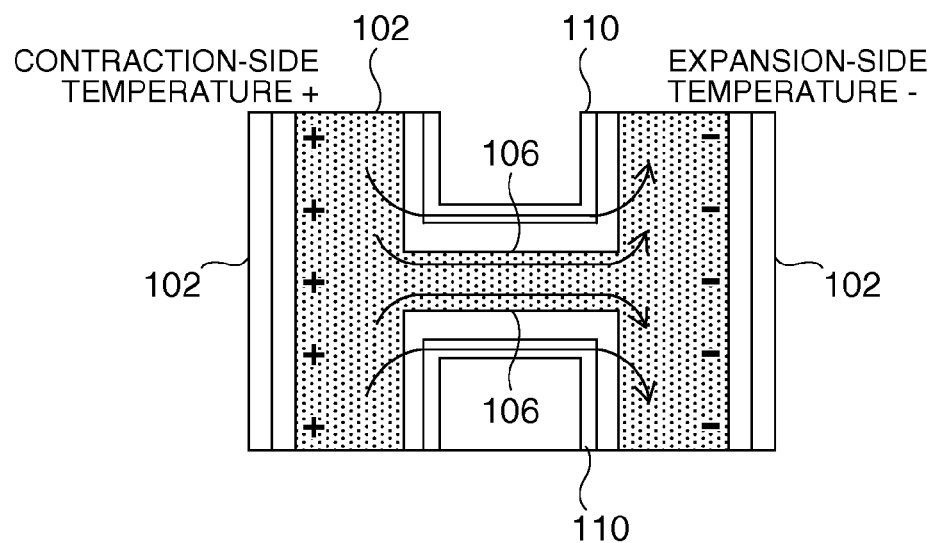

With this configuration, the crystal resonator element 1 vibrates in the flexural vibration mode in the adiabatic region (see FIG. 4B).

Next, the excitation electrodes 20 and 21 formed on the pair of resonating arms 12 and 13 and the like will be described in detail.

On the pair of resonating arms 12 and 13 and the like, the excitation electrodes 20 and 21 to which different-polarity external driving signals are applied are formed.

Therefore, the excitation electrodes 20 and 21 are formed to be spaced from each other so that they are not short-circuited.

As shown in FIG. 1E, the excitation electrode 20 is formed on the groove portion 18 of the resonating arm 12, and the excitation electrode 21 is formed on both side surfaces 12a and 12b of the resonating arm 12.

The excitation electrodes 21 on both side surfaces 12a and 12b of the resonating arm 12 are connected to each other by a connection electrode 22 (see FIG. 1A) formed on the weight portion 17.

On the other hand, the excitation electrode 21 is formed on the groove portion 18 of the resonating arm 13, and the excitation electrode 20 is formed on both side surfaces 13a and 13b of the resonating arm 13.

The excitation electrodes 20 on both side surfaces 13a and 13b of the resonating arm 13 are connected to each other by a connection electrode 23 (see FIG. 1A) formed on the weight portion 17.

The excitation electrode 20 on the principal surface 10a side of the groove portion 18 of the resonating arm 12 and the excitation electrode 20 on the principal surface 10b side are connected to each other by the excitation electrodes 20 formed on both side surfaces 13a and 13b of the resonating arm 13.

On the other hand, the excitation electrode 21 on the principal surface 10a side of the groove portion 18 of the resonating arm 13 and the excitation electrode 21 on the principal surface 10b side are connected to each other by the excitation electrodes 21 formed on both side surfaces 12a and 12b of the resonating arm 12.

As shown in FIG. 1A, the excitation electrodes 20 and 21 are led out up to the supporting portions 15 through the base portion 11, and the lead-out portions serve as mount electrodes 20a and 21a which are used when the crystal resonator element 1 is fixed to the external member such as a package. The mount electrodes 20a and 21a are formed on both principal surfaces 10a and 10b.

Next, an overview of a method of forming the excitation electrodes 20 and 21 will be described.

The excitation electrodes 20 and 21 are formed in a desired electrode pattern shape by the following steps. First, an electrode material such as Ni, Cr, Au, Ag, Al, or Cu is applied to approximately the entire surface of the crystal resonator element 1 by a method such as deposition or sputtering. Subsequently, a photosensitive resist is applied so as to cover the applied electrode material and is subjected to exposure and patterning in accordance with a desired electrode pattern shape using a photolithography technique. After that, unnecessary exposed portions of the electrode material are removed by etching (wet-etching), whereby the excitation electrodes 20 and 21 having a desired electrode pattern shape are obtained.

Therefore, the non-electrode region of the groove portion 18 is formed when the unnecessary electrode material is removed by etching.

Moreover, thermal conductivity of a quartz crystal is about 6.2 to about 10.4 W/(m·K), and thermal conductivity of Au, for example, used as the electrode material of the excitation electrodes 20 and 21 is about 315 W/(m·K) which is much larger than of a quartz crystal. The same can be said for the other electrode materials (Ni, Cr, and the like).

As described above, in the crystal resonator element 1 of the first embodiment, the groove portion 18 has the non-electrode region which extends from a part of the first side surface 18a close to the bottom portion 18c to a part of the second side surface 18b close to the bottom portion 18c and in which the excitation electrodes 20 and 21 are not provided.

Due to this configuration, in the crystal resonator element 1, it is possible to suppress thermal conduction by the excitation electrodes 20 and 21 in such portions (the non-electrode region).

As a result, in the crystal resonator element 1, the transfer of heat from the contracted portion to the expanded portion during flexural vibration is slowed down over a wider range of areas as compared to a configuration in which only the excitation electrodes 20 and 21 on the bottom portion 18c of the groove portion 18 are removed, for example. Thus, it is possible to further increase the relaxation time τ and to further decrease the thermal relaxation frequency f0.

Through the decrease of the thermal relaxation frequency f0, in the crystal resonator element 1, the curve F in FIG. 4B shifts to the vicinity of the curve F1 in the lower frequency direction. Thus, it is possible to improve the Q value in the adiabatic region.

Moreover, in the crystal resonator element 1, the resonating arms 12 and 13 include the arm portion 16 which is disposed close to the base portion 11, and the weight portion 17 which is disposed closer to the tip end of each of the resonating arms than the arm portion 16 and which has a larger width than the arm portion 16. Through the effect of improving the Q value by the weight portion 17 which increases the inertial mass, it is possible to shorten the resonating arms 12 and 13 while maintaining the Q value, for example.

Therefore, in the crystal resonator element 1, it is possible to achieve further miniaturization while maintaining the Q value.

On the other hand, when the weight portion 17 is provided in the crystal resonator element 1, for example, the amount of deformation during flexural vibration increases as compared to a configuration in which no weight portion 17 is provided. That is, the compressive and tensile stress occurring therein increases.

However, in the crystal resonator element 1, since thermal conduction by the excitation electrodes 20 and 21 can be suppressed in the non-electrode region of the groove portion 18, the transfer of heat from the contracted portion to the expanded portion is slowed down. Thus, the thermoelastic loss can be suppressed more effectively when the weight portion 17 is provided.

Moreover, the crystal resonator element 1 includes a pair (two) of resonating arms 12 and 13 and the base portion 11 which form a tuning fork. Thus, it is possible to provide a tuning fork-type resonator element having the above-described effects such as the improved Q value.

Second Embodiment

Next, a resonator having the crystal resonator element described above will be described as a second embodiment.

Figure 2A:
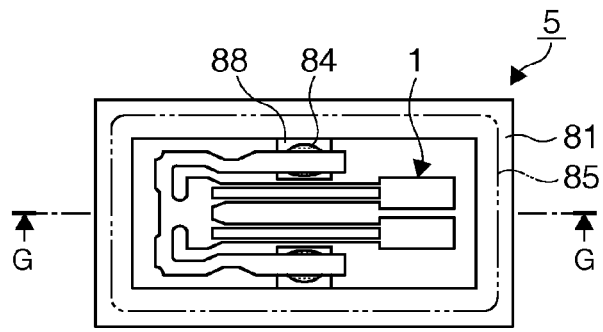
Figure 2B:
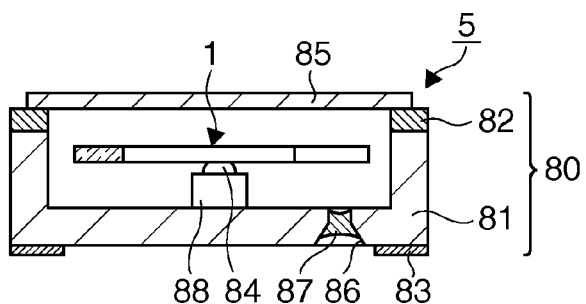

FIGS. 2A and 2B are schematic diagrams showing a simplified configuration of a resonator according to the second embodiment, in which FIG. 2A is a planar diagram, and FIG. 2B is a cross-sectional diagram taken along the line G-G in FIG. 2A. The electrodes of the crystal resonator element are not illustrated for better understanding of the drawings.

As shown in FIGS. 2A and 2B, a crystal resonator 5 as a resonator includes the crystal resonator element 1 of the first embodiment and a package 80 that accommodates the crystal resonator element 1.

The package 80 includes a package base 81, a shim ring 82, a cover 85, and the like.

The package base 81 has a recess so that the crystal resonator element 1 can be accommodated therein, and connection pads 88 connected to the mount electrodes 20a and 21a (not shown; see FIGS. 1A and 1B) of the crystal resonator element 1 are provided in the recess.

The connection pads 88 are connected to wirings inside the package base 81 so as to be electrically connected to an external connection terminal 83 provided at the periphery of the package base 81.

The shim ring 82 is provided around the recess of the package base 81. A penetration hole 86 is provided on the bottom of the package base 81.

The crystal resonator element 1 is attached to the connection pads 88 of the package base 81 by a conductive adhesive 84. In the package 80, the cover 85 covering the recess of the package base 81 is shim-welded to the shim ring 82.

A sealing material 87 made from metal is filled in the penetration hole 86 of the package base 81. The sealing material 87 is melted in a depressurized atmosphere and solidified to airtightly seal the penetration hole 86 so that the inside of the package base 81 is maintained in the depressurized state.

The crystal resonator 5 oscillates (resonates) at a predetermined resonance frequency (for example, 32 kHz) when the crystal resonator element 1 is excited by an external driving signal supplied through the external connection terminal 83.

As described above, since the crystal resonator 5 includes the crystal resonator element 1, it is possible to provide a crystal resonator having excellent vibration properties through the improvement in the Q value, for example.

Third Embodiment

Next, an oscillator having the crystal resonator element described above will be described as a third embodiment.

Figure 3A:
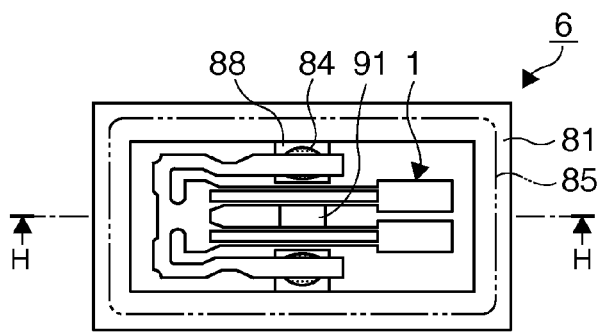
Figure 3B:
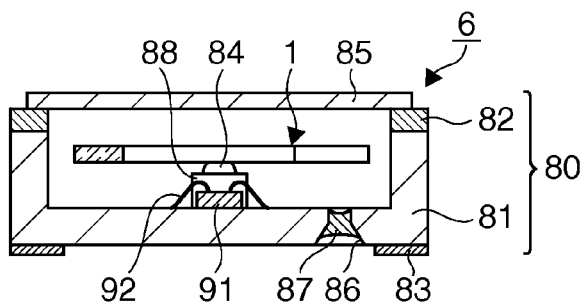

FIGS. 3A and 3B are schematic diagrams showing a simplified configuration of an oscillator according to the third embodiment, in which FIG. 3A is a planar diagram, and FIG. 3B is a cross-sectional diagram taken along the line H-H in FIG. 3A. The electrodes of the crystal resonator element are not illustrated for better understanding of the drawings.

A crystal oscillator 6 as an oscillation has a configuration in which the crystal resonator 5 described above further includes a circuit element. The same portions as those of the crystal resonator 5 will be denoted by the same reference numerals, and description thereof is omitted.

As shown in FIGS. 3A and 3B, the crystal oscillator 6 includes the crystal resonator element 1 of the first embodiment, an IC chip 91 as a circuit element having an oscillation circuit that oscillates the crystal resonator element 1, and the package 80 that accommodates the crystal resonator element 1 and the IC chip 91.

The IC chip 91 is attached to the bottom of the package base 81 and is connected to other wirings by metal wires 92 such as Au or Al.

The crystal oscillator 6 oscillates (resonates) at a predetermined resonance frequency (for example, 32 kHz) when the crystal resonator element 1 is excited by a driving signal supplied from the oscillation circuit of the IC chip 91.

As described above, since the crystal oscillator 6 includes the crystal resonator element 1, it is possible to provide a crystal oscillator having excellent vibration properties through the improvement in the Q value, for example.

In the respective embodiments described above, the supporting portion 15 and the weight portion 17 of the crystal resonator element 1 may not be provided.

The supporting portion 15 is not limited to a pair of supporting portions but may be provided in only one side.

In the respective embodiments described above, although the groove portion 18 is provided on both principal surfaces 10a and 10b of the resonating arms 12 and 13, the invention is not limited to this, and the groove portion 18 may be provided on only one of the principal surfaces (10a or 10b).

Moreover, in the respective embodiments described above, although the number of resonating arms 12 and 13 has been described to be one pair (two), the number of resonating arms is not limited to this but may be one or three or more.

Furthermore, in the respective embodiments described above, although the resonator element is formed of a quartz crystal, the invention is not limited to this. For example, the resonator element may be formed of a piezoelectric material such as lithium tantalate ($LiTaO_3$), lithium tetraborate ($Li_2B_4O_7$), lithiumniobate ($LiNbO_3$), lead zirconate titanate (PZT), zinc oxide (ZnO), or aluminum nitride (AlN); or a silicon having a piezoelectric material such as zinc oxide (ZnO) or aluminum nitride (AlN) as a coating thereof.

The entire disclosure of Japanese Patent Application No. 2010-156577, filed Jul. 9, 2010 is expressly incorporated by reference herein.

What is claimed is:

1. A resonator element comprising:
   a base portion;
   a pair of resonating arms extending from the base portion along a first direction in plan view, a groove portion being arranged along the first direction on at least one of two principal surfaces, which have a front-and-rear relationship with respect to each other, wherein:
   the principal surface on which the groove portion is arranged includes one principal surface portion and another principal surface portion which sandwich an opening of the groove portion therebetween in plan view and are aligned along a second direction crossing the first direction,
   the groove portion includes:
      a first side surface that is connected to the one principal surface portion and on which a first excitation electrode portion is arranged at a side of the one principal surface portion,
      a second side surface that is connected to the other principal surface portion and on which a second excitation electrode portion is arranged at a side of the other principal surface portion, and
      an inner surface that is arranged between the first and second side surfaces; and
   the groove portion has a non-electrode region in which no electrode is arranged, the non-electrode region including the inner surface and extending from an inner surface-side part of the first side surface to an inner surface-side part of the second side surface.

2. The resonator element according to claim 1,
   wherein the resonating arm includes, in plan view, a weight portion and an arm portion which is disposed between the weight portion and the base portion.

3. The resonator element according to claim 2,
   wherein a width of the weight portion is wider than that of the arm portion along the second direction.

4. The resonator element according claim 1, further comprising:
   a support portion that is connected to the base portion and is aligned with the resonating arm along the second direction.

5. The resonator element according claim 2, further comprising:
   a support portion that is connected to the base portion and is aligned with the resonating arm along the second direction.

6. The resonator element according claim 3, further comprising:
   a support portion that is connected to the base portion and is aligned with the resonating arm along the second direction.

7. The resonator element according to claim 1,
   wherein a pair of notch portions that are aligned along the second direction is arranged in the base portion.

8. The resonator element according to claim 2,
   wherein a pair of notch portions that are aligned along the second direction is arranged in the base portion.

9. The resonator element according to claim 3,
   wherein a pair of notch portions that are aligned along the second direction is arranged in the base portion.

10. A resonator comprising:
    the resonator element according to claim 1, and
    a package that accommodates the resonator element.

11. A resonator comprising:
    the resonator element according to claim 2, and
    a package that accommodates the resonator element.

12. A resonator comprising:
    the resonator element according to claim 3, and
    a package that accommodates the resonator element.

13. An oscillator, comprising:
    the resonator element according to claim 1; and
    a circuit.

14. An oscillator, comprising:
    the resonator element according to claim 2; and
    a circuit.

15. An oscillator, comprising:
    the resonator element according to claim 3; and
    a circuit.

16. An oscillator, comprising:
    the resonator element according to claim 4; and
    a circuit.

17. An oscillator, comprising:
    the resonator element according to claim 5; and
    a circuit.

* * * * *